US006242152B1

(12) United States Patent
Staral et al.

(10) Patent No.: US 6,242,152 B1
(45) Date of Patent: Jun. 5, 2001

(54) THERMAL TRANSFER OF CROSSLINKED MATERIALS FROM A DONOR TO A RECEPTOR

(75) Inventors: John S. Staral, Woodbury; Jeffrey C. Chang, North Oaks; Kenneth L. Hanzalik, Arden Hills, all of MN (US)

(73) Assignee: 3M Innovative Properties, St. Paul, MN (US)

( * ) Notice: Subject to any disclaimer, the term of this patent is extended or adjusted under 35 U.S.C. 154(b) by 0 days.

(21) Appl. No.: 09/563,597

(22) Filed: May 3, 2000

(51) Int. Cl.[7] ................................ G03F 7/34; G03C 1/76; G03C 1/73; G03C 1/91

(52) U.S. Cl. ........................ 430/201; 430/200; 430/271.1; 430/273.1; 430/275.1; 430/964

(58) Field of Search .................................... 430/200, 201, 430/964, 271.1, 273.1, 275.1

(56) References Cited

U.S. PATENT DOCUMENTS

| | | | |
|---|---|---|---|
| 4,252,671 | 2/1981 | Smith . | |
| 5,089,372 | 2/1992 | Kirihata et al. | 430/167 |
| 5,166,024 | 11/1992 | Bugner et al. | 430/70 |
| 5,171,650 | 12/1992 | Ellis et al. | 430/201 |
| 5,256,506 | 10/1993 | Ellis et al. | 430/201 |
| 5,308,737 * | 5/1994 | Bills et al. | 430/201 |
| 5,318,938 | 6/1994 | Hampl, Jr. et al. | 503/227 |
| 5,326,619 * | 7/1994 | Dower et al. | 430/201 |
| 5,351,617 | 10/1994 | Williams et al. | 101/467 |
| 5,352,653 | 10/1994 | Flosenzier et al. | 430/201 |
| 5,521,035 | 5/1996 | Wolk et al. | 430/200 |
| 5,607,896 | 3/1997 | Hutt | 430/201 |
| 5,670,449 | 9/1997 | Simpson et al. | 503/227 |
| 5,695,907 | 12/1997 | Chang | 430/201 |
| 5,725,989 | 3/1998 | Chang et al. | 430/201 |
| 5,828,488 | 10/1998 | Ouderkirk et al. | 359/487 |
| 5,863,860 | 1/1999 | Patel et al. | 430/201 |
| 5,882,774 | 3/1999 | Jonza et al. | 428/212 |
| 5,922,481 | 7/1999 | Etzbach et al. | 428/690 |
| 5,994,028 * | 11/1999 | Lee | 430/201 |
| 5,998,085 | 12/1999 | Isberg et al. | 430/201 |
| 6,030,550 | 2/2000 | Angelopoulos et al. | 252/500 |
| 6,090,524 * | 7/2000 | Deboer et al. | 430/201 |

FOREIGN PATENT DOCUMENTS

| | | |
|---|---|---|
| 0 414 225 A2 | 2/1991 | (EP) . |
| 9-255774 | 9/1997 | (JP) . |
| WO 95/17303 | 6/1995 | (WO) . |
| WO 97/33193 | 12/1997 | (WO) . |

OTHER PUBLICATIONS

Synthetic Metals, 84 (1987) pp 437–438, "A blue light emitting copolymer with charge transporting and photo–crosslinkable functional units" Li et al.

Synthetic Metals, 107 (1999) pp 203–207, "Improved efficiencies of light–emitting diodes through incorporation of charge transporting components in tri–block polymers" Chen et al.

Polymer Bulletin, 43 (1999) pp 135–142, "Synthesis and characterization of partially crosslinked poly (N–vinylcarbazole–vinylalcohol) copolymers with polypyridyl Ru(II) luminophores: Potential materials for electroluminescence" A.A. Farah & W.J. Pietro.

Polymers for Advanced Technologies, 8, (1997) pp 468–470, "Oxygen–crosslinked Polysilance: The New Class of Si–related Material for Electroluminescent Devices" Hiraoka et al.

Chem Mater, 10, (1998) pp 1668–1676, "New Triarylamine–Containing Polymers as Hole Transport Materials in Organic Light–Emitting Diodes: Effect of Polymer Structure and Cross–Linking on Device Characteristics" Bellmann et al.

Encyclopedia of Polymer Science & Engineering, 4, (1986) pp 418–449, "Cross–Linking With Radiation" John Wiley & Sons.

Encyclopedia of Polymer Science & Engineering, 4, (1986) pp 350–390, "Cross–Linking" John Wiley & Sons.

Encyclopedia of Polymer Science & Engineering, 11, (1988) pp 186–212, "Photopolymerization".

Advanced Materials, Communications, (1998–1999) "Covalently Interlinked Organic LED Transport Layers via Spin–Coating/Siloxane Condensation" W. Li et al.

Polymer Handbook, VII, (1989) pp 519–557, Solubility Parameter Values, E.A. Grulke, J. Brandrup, ed.

* cited by examiner

*Primary Examiner*—Richard L. Schilling
(74) *Attorney, Agent, or Firm*—Robert J. Pechman

(57) ABSTRACT

The present invention provides a thermal transfer donor element that includes a transfer layer comprising a fully or partially crosslinked material. The crosslinked transfer layer can be imagewise transferred from the donor element to a proximate receptor by imaging the donor element with radiation that can be absorbed and converted into heat by a light-to-heat converter included in the donor element. The heat generated during imaging is sufficient to effect transfer of the crosslinked transfer layer.

35 Claims, No Drawings

THERMAL TRANSFER OF CROSSLINKED MATERIALS FROM A DONOR TO A RECEPTOR

This invention relates to methods for light induced transfer of layers from a donor element to a receptor.

BACKGROUND

Some transfer methods include thermal mass transfer of crosslinkable components from a donor element to a receptor. The transferred material may then be crosslinked on the receptor after transfer. While crosslinking after transfer has been taught to provide such desirable qualities as toughness, durability, solvent resistance, and other performance related benefits, crosslinking after transfer can be an inconvenient extra step in the production of an imaged receptor.

SUMMARY OF THE INVENTION

The present inventors have made the surprising discovery that, contrary to the teachings of the known references, good images can be formed by light induced thermal transfer even when the transferred material has been partially or fully crosslinked before transfer. Crosslinking before transfer can have the benefit that crosslinking can be performed on the donor web on a continuous process basis. As a value added step, crosslinking of transfer layer material may be performed by the manufacturer of the donor material and need not be performed by the individual using the donor material for image formation. In addition, crosslinked transfer layers may be more robust than corresponding uncrosslinked transfer layers, thereby allowing easier handling of donor sheets and/or use or storage of donor sheets, for example in stacks or rolls, without significant damage to the transfer layer. Donors having crosslinked transfer layers can also be used to transfer materials to sensitive receptors that might be damaged by, for example, the heat or radiation that might otherwise be used to crosslink the materials after transfer.

In one aspect, the present invention provides a thermal transfer donor element that includes a substrate, a transfer layer that includes a crosslinked material, and a light-to-heat converter material disposed in the thermal transfer donor element to generate heat when the donor element is exposed to imaging radiation, the heat generated being sufficient to imagewise transfer the transfer layer from the donor element to a proximately located receptor. The light-to-heat converter can be disposed in a separate light-to-heat conversion layer disposed between the substrate and the transfer layer.

In another aspect, the present invention provides a method of patterning which includes the steps of placing the transfer layer of a thermal transfer donor element proximate a receptor and imagewise transferring portions of the transfer layer to the receptor by selectively exposing the donor element to imaging radiation capable of being absorbed and converted into heat by the converter material, wherein the donor element includes a substrate, a transfer layer that includes a crosslinked material, and a light-to-heat converter material.

In yet another aspect, the present invention provides a method of making a thermal transfer donor element, including the steps of providing a donor substrate, coating a layer that includes a crosslinkable material adjacent to the substrate, crosslinking the crosslinkable material to form a crosslinked transfer layer, and disposing a light-to-heat converter material in the donor element, the light-to-heat converter material capable of generating heat upon being exposed to imaging radiation, the heat generated being sufficient to imagewise transfer portions of the crosslinked transfer layer.

DETAILED DESCRIPTION

The present invention is believed to be applicable to thermal transfer of materials from a donor element to a receptor. In particular, the present invention is directed to thermal mass transfer donor elements, and methods of thermal transfer using donor elements, where the transfer layers of the donor elements include a crosslinked material. Donor elements of the present invention are typically constructed of a substrate, a transfer layer that includes a crosslinked or partially crosslinked organic, inorganic, organometallic or polymeric material, and a light-to-heat converter material.

Crosslinked materials can be transferred from the transfer layer of a donor element to a receptor substrate by placing the transfer layer of the donor element adjacent to the receptor and irradiating the donor element with imaging radiation that can be absorbed by the light-to-heat converter material and converted into heat. The donor can be exposed to imaging radiation through the donor substrate, or through the receptor, or both. The radiation can include one or more wavelengths, including visible light, infrared radiation, or ultraviolet radiation, for example from a laser, lamp, or other such radiation source. Portions of the transfer layer can be selectively transferred to a receptor in this manner to imagewise form patterns of the crosslinked material on the receptor. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can further be controlled by irradiating the donor element through a mask.

The mode of thermal mass transfer can vary depending on the type of irradiation, the type of materials and properties of the light-to-heat converter, the type of materials in the transfer layer, etc., and generally occurs via one or more mechanisms, one or more of which may be emphasized or de-emphasized during transfer depending on imaging conditions, donor constructions, and so forth. One mechanism of thermal transfer includes thermal melt-stick transfer whereby heating the transfer layer results in an increase in the relative adhesion of the transfer layer to the receptor's surface. As a result selected portions of the transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. The present invention contemplates transfer modes that include one or more of these and other mechanisms whereby the heat generated in light-to-heat converter material of a donor element can be used to cause the transfer of crosslinked materials from a transfer layer to receptor surface.

A variety of radiation-emitting sources can be used to heat donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (≧100 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 $J/cm^2$ or more. Other radiation sources and irradiation conditions can be suitable based on, among other things, the donor element construction, the transfer layer material, the mode of thermal transfer, and other such factors.

When high spot placement accuracy is required (e.g., for high information full color display applications) over large substrate areas, a laser is particularly useful as the radiation source. Laser sources are also compatible with both large rigid substrates (e.g., 1 m×1 m×1.1 mm glass) and continuous or sheeted film substrates (e.g., 100 μm polyimide sheets).

During imaging, the donor element can be brought into intimate contact with a receptor (as might typically be the case for thermal melt-stick transfer mechanisms) or the donor element can be spaced some distance from the receptor (as can be the case for ablative transfer mechanisms). In at least some instances, pressure or vacuum can be used to hold the donor element in intimate contact with the receptor. In some instances, a mask can be placed between the donor element and the receptor. Such a mask can be removable or can remain on the receptor after transfer. A radiation source can then be used to heat the light-to-heat converter material in an imagewise fashion to perform patterned transfer of the crosslinked transfer layer from the donor element to the receptor.

Typically, selected portions of the transfer layer are transferred to the receptor without transferring significant portions of the other layers of the thermal mass transfer element, such as an optional interlayer or a light-to-heat conversion layer (discussed in more detail below).

Large donor elements can be used, including donor elements that have length and width dimensions of a meter or more. In operation, a laser can be rastered or otherwise moved across the large donor element, the laser being selectively operated to illuminate portions of the donor element according to a desired pattern. Alternatively, the laser may be stationary and the donor element and/or receptor substrate moved beneath the laser.

In some instances, it may be necessary, desirable, and/or convenient to sequentially use two or more different donor elements to form a device, such as an optical display. For example, a black matrix may be formed, followed by the thermal transfer of a color filter in the windows of the black matrix. As another example, a black matrix may be formed, followed by the thermal transfer of one or more layers of a thin film transistor. As another example, multiple layer devices can be formed by transferring separate layers or separate stacks of layers from different donor elements. Multilayer stacks can also be transferred as a single transfer unit from a single donor element. Examples of multilayer devices include transistors such as organic field effect transistors (OFETs), organic electroluminescent pixels and/or devices, including organic light emitting diodes (OLEDs). Multiple donor sheets can also be used to form separate components in the same layer on the receptor. For example, three different color donors can be used to form color filters for a color electronic display. Also, separate donor sheets, each having multiple layer transfer layers, can be used to pattern different multilayer devices (e.g., OLEDs that emit different colors, OLEDs and OFETs that connect to form addressable pixels, etc.). A variety of other combinations of two or more donor elements can be used to form a device, each donor element forming one or more portions of the device. It will be understood other portions of these devices, or other devices on the receptor, may be formed in whole or in part by any suitable process including photolithographic processes, ink jet processes, and various other printing or mask-based processes.

As identified above, donor elements of the present invention can include a donor substrate, a crosslinked or partially crosslinked transfer layer, and a light-to-heat converter material. These and other features of donor elements, which may be suitable for use in the present invention, are described below.

The donor substrate can be a polymeric film. One suitable type of polymer film is a polyester film, for example, polyethylene terephthalate or polyethylene naphthalate films. However, other films with sufficient optical properties, including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of the donor element during transfer. The typical thickness of the donor substrate ranges from 0.025 to 0.15 mm, preferably 0.05 to 0.1 mm, although thicker or thinner donor substrates may be used.

The materials used to form the donor substrate and any adjacent layers (e.g., an optional heat transport layer, an optional insulating layer, or an optional light-to-heat conversion layer) can be selected to improve adhesion between the donor substrate and the adjacent layer, to control temperature transport between the substrate and the adjacent layer, to control the intensity and/or direction of imaging radiation transport, and the like. An optional priming layer can be used to increase uniformity during the coating of subsequent layers onto the substrate and also increase the bonding strength between the donor substrate and adjacent layers. One example of a suitable substrate with primer layer is available from Teijin Ltd. (Product No. HPE100, Osaka, Japan).

Donor elements of the present invention also include a transfer layer. Transfer layers can include any suitable material or materials that are crosslinked or partially crosslinked, disposed in one or more layers with or without a binder, that can be selectively transferred as a unit or in portions by any suitable transfer mechanism when the donor element is exposed to imaging radiation that can be absorbed by the light-to-heat converter material and converted into heat.

The transfer layer can include fully or partially crosslinked organic, inorganic, organometallic, or polymeric materials. Examples of suitable materials include those which can be crosslinked by exposure to heat or radiation, and/or by the addition of an appropriate chemical curative (e.g., $H_2O$, $O_2$, etc.). Radiation curable materials are especially preferred. Suitable materials include those listed in the *Encyclopedia of Polymer Science and Engineering,* Vol. 4, pp. 350–390 and 418–449 (John Wiley & Sons, 1986), and Vol. 11, pp. 186–212 (John Wiley & Sons, 1988).

Examples of materials that can selectively patterned from donor elements as crosslinked transfer layers and/or as materials incorporated in transfer layers that include at least one crosslinked component include colorants (e.g., pigments and/or dyes dispersed in a binder), polarizers, liquid crystal materials, particles (e.g., spacers for liquid crystal displays, magnetic particles, insulating particles, conductive particles), emissive materials (e.g., phosphors and/or organic electroluminescent materials), non-emissive materials that may be incorporated into an emissive device (for example, an electroluminescent device) hydrophobic materials (e.g., partition banks for ink jet receptors), hydrophilic materials, multilayer stacks (e.g., multilayer device constructions such as organic electroluminescent devices), microstructured or nanostructured layers, photoresist, metals, polymers, adhesives, binders, and bio-materials, and other suitable materials or combination of materials.

The transfer layer can be coated onto the donor substrate, optional light-to-heat conversion layer (described below), optional interlayer (described below), or other suitable donor element layer. The transfer layer may be applied by any suitable technique for coating a material that can be crosslinked such as, for example, bar coating, gravure coating, extrusion coating, vapor deposition, lamination and other such techniques. Prior to, after or simultaneous with coating, the transfer layer material or portions thereof may be crosslinked, for example by heating, exposure to radiation, and/or exposure to a chemical curative, depending upon the material. Alternatively, one may wait and crosslink the material at some later time, such as immediately before imaging. In another embodiment, a partially crossinked material can be transferred, optionally followed by additional crosslinking of the material during and/or subsequent to transfer.

Particularly well suited transfer layers include materials that are useful in display applications. Thermal mass transfer according to the present invention can be performed to pattern one or more materials on a receptor with high precision and accuracy using fewer processing steps than for photolithography-based patterning techniques, and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers, phosphor layers, organic electroluminescent devices, organic transistors, and other such elements, devices, or portions thereof that can be useful in displays, alone or in combination with other elements that may or may not be patterned in a like manner.

In particular embodiments, the transfer layer can include a colorant. Pigments or dyes, for example, may be used as colorants. Pigments having good color permanency and transparency such as those disclosed in the *NPIRI Raw Materials Data Handbook, Volume* 4 (*Pigments*) are especially preferred. Examples of suitable transparent colorants include Ciba-Geigy Cromophtal Red A2B™, Dainich-Seika ECY-204™, Zeneca Monastral Green 6Y-CL™, and BASF Heliogen Blue L6700™. Other suitable transparent colorants include Sun RS Magenta 234-007™, Hoechst GS Yellow GG 11-1200™, Sun GS Cyan 249-0592™, Sun RS Cyan 248-061, Ciba-Geigy BS Magenta RT-333D™, Ciba-Geigy Microlith Yellow 3G-WA™, Ciba-Geigy Microlith Yellow 2R-WA™, Ciba-Geigy Microlith Blue YG-WA™, Ciba-Geigy Microlith Black C-WA™, Ciba-Geigy Microlith Violet RL-WA™, Ciba-Geigy Microlith Red RBS-WA™, any of the Heucotech Aquis II™ series, any of the Heucosperse Aquis III™ series, and the like. Another class of pigments than can be used for colorants in the present invention are various latent pigments such as those available from Ciba-Geigy. Transfer of colorants by thermal imaging is disclosed in U.S. Pat. Nos. 5,521,035; 5,695,907; and 5,863,860.

The transfer layer can optionally include various additives. Suitable additives can include IR absorbers, dispersing agents, surfactants, stabilizers, plasticizers, crosslinking agents and coating aids. The transfer layer may also contain a variety of additives including but not limited to dyes, plasticizers, UV stabilizers, film forming additives, and adhesives. Plasticizers can be incorporated into the crosslinked transfer layer to facilitate transfer of the transfer layer. In one embodiment, reactive plasticizers are incorporated into the transfer layer to facilitate transfer and, subsequent to transfer, reacted with the other materials comprising the transfer layer as described in co-assigned U.S. patent application Ser. No. 09/392,386 (entitled "Thermal Transfer with a Plasticizer-Containing Transfer Layer"). In another embodiment, a plasticizer is included in the crosslinked transfer layer to facilitate transfer of the transfer layer and subsequently volatilized either during or subsequent to transfer. Suitable dispersing resins include vinyl chloride/vinyl acetate copolymers, poly(vinyl acetate)/crotonic acid copolymers, polyurethanes, styrene maleic anhydride half ester resins, (meth)acrylate polymers and copolymers, poly(vinyl acetals), poly(vinyl acetals) modified with anhydrides and amines, hydroxy alkyl cellulose resins and styrene acrylic resins.

In some embodiments, the transfer layer can include one or more materials useful in emissive displays such as organic electroluminescent displays and devices, or phosphor-based displays and devices. For example, the transfer layer can include a crosslinked light emitting polymer or a crosslinked charge transport material, as well as other organic conductive or semiconductive materials, whether crosslinked or not. For polymeric OLEDs, it may be desirable to crosslink one or more of the organic layers to enhance the stability of the final OLED device. Crosslinking one or more organic layers for an OLED device prior to thermal transfer may also be desired. Crosslinking before transfer can provide more stable donor media, better control over film morphology that might lead to better transfer and/or better performance properties in the OLED device, and/or allow for the construction of unique OLED devices and/or OLED devices that might be more easily prepared when crosslinking in the device layer(s) is performed prior to thermal transfer.

Examples of light emitting polymers include poly(phenylenevinylene)s (PPVs), poly-para-phenylenes (PPPs), and polyfluorenes (PFs). Specific examples of crosslinkable light emitting materials that can be useful in transfer layers of the present invention include the blue light emitting poly(methacrylate) copolymers disclosed in Li et al., *Synthetic Metals* 84, pp. 437–438 (1997), the crosslinkable triphenylamine derivatives (TPAs) disclosed in Chen et al., *Synthetic Metals* 107, pp. 203–207 (1999), the crosslinkable oligo- and poly(dialkylfluorene)s disclosed in Klarner et al., *Chem. Mat.* 11, pp. 1800–1805 (1999), the partially crosslinked poly(N-vinylcarbazole-vinylalcohol) copolymers disclosed in Farah and Pietro, *Polymer Bulletin* 43, pp. 135–142 (1999), and the oxygen-crosslinked polysilanes disclosed in Hiraoka et al., *Polymers for Advanced Technologies* 8, pp. 465–470 (1997).

Specific examples of crosslinkable transport layer materials for OLED devices that can be useful in transfer layers of the present invention include the silane functionalized triarylamine, the poly(norbornenes) with pendant triarylamine as disclosed in Bellmann et al., *Chem Mater* 10, pp. 1668–1678 (1998), bis-functionalized hole transporting triarylamine as disclosed in Bayerl et al., *Macromol. Rapid Commun.* 20, pp. 224–228 (1999), the various crosslinked conductive polyanilines and other polymers as disclosed in U.S. Pat. No. 6,030,550, the crosslinkable polyarylpolyamines disclosed in International Publication WO 97/33193, and the crosslinkable triphenyl amine-containing polyether ketone as disclosed in Japanese Unexamined Patent Publication Hei 9-255774.

Crosslinked light emitting, charge transport, or charge injection materials used in transfer layers of the present invention may also have dopants incorporated therein either prior to or after thermal transfer. Dopants may be incorporated in materials for OLEDs to alter or enhance light emission properties, charge transport properties and/or other such properties.

Thermal transfer of materials from donor sheets to receptors for emissive display and device applications is disclosed in U.S. Pat. Nos. 5,998,085 and 6,114,088, and in PCT Publication WO 00/41893.

The donor element can also include an optional transfer assist layer, most typically provided as a layer of adhesive coated on the transfer layer as the outermost layer of the donor element. The adhesive can serve to promote complete transfer of the transfer layer, especially during the separation of the donor from the receptor substrate after imaging. Exemplary transfer assist layers include colorless, transparent materials with a slight tack or no tack at room temperature, such as the family of resins sold by ICI Acrylics under the trade designation Elvacite™ (e.g., Elvacite™ 2776). Another suitable material is the adhesive emulsion sold under the trade designation Daratak™ from Hampshire Chemical Corporation. The optional adhesive layer may also contain a radiation absorber that absorbs light of the same frequency as the imaging laser or light source. Transfer assist layers can also be optionally disposed on the receptor.

The donor elements may also include light-to-heat converter materials to absorb imaging radiation and convert it into heat for transfer. The imaging radiation absorbent material may be included within any one or more layers of the donor element, including in the transfer layer itself. For example, when an infrared emitting imaging radiation source is used, an infrared absorbing dye may be used in the transfer layer. In addition to, or in place of, disposing radiation absorbent materials in the transfer layer, a separate radiation absorbent light-to-heat conversion layer (LTHC) may be used. LTHC layers are preferably located between the substrate and the transfer layer.

Typically, the radiation absorber in the LTHC layer (or other layers) absorbs light in the infrared, visible, and/or ultraviolet regions of the electromagnetic spectrum and converts the absorbed radiation into heat. The radiation absorber is typically highly absorptive of the selected imaging radiation, providing a LTHC layer with an optical density at the wavelength of the imaging radiation in the range of about 0.1 to 4, or from about 0.2 to 3.5.

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. The amount of carbon black may range, for example, from 1 to 50 wt. % or, preferably, 2 to 30 wt. %. A suitable LTHC layer formulation is given in Table I. The formulation of Table I can be coated onto a donor substrate utilizing a suitable solvent, for example, and then typically dried and crosslinked (e.g., by exposure to ultraviolet radiation or an electron beam).

TABLE I

LTHC Coating Formulation

| Component | Parts by Weight |
|---|---|
| Raven ™ 760 Ultra carbon black pigment (available from Columbian Chemicals, Atlanta, GA) | 8.87 |
| Butvar ™ B-98 (polyvinylbutyral resin, available from Monsanto, St. Louis, MO) | 1.59 |
| Joncryl ™ 67 (acrylic resin, available from S. C. Johnson & Son, Racine, WI) | 4.74 |
| Elvacite ™ 2669 (acrylic resin, available from ICI Acrylics, Wilmington, DE) | 32.1 |
| Disperbyk ™ 161 (dispersing aid, available from Byk Chemie, Wallingford, CT) | 0.78 |
| FC-430 ™ (fluorochemical surfactant, available from 3M, St. Paul, MN) | 0.03 |
| Ebecryl ™ 629 (epoxy novolac acrylate, available from UCB Radcure, N. Augusta, SC) | 48.15 |
| Irgacure ™ 369 (photocuring agent, available from Ciba Specialty Chemicals, Tarrytown, NY) | 3.25 |
| Irgacure ™ 184 (photocuring agent, available from Ciba Specialty Chemicals, Tarrytown, NY) | 0.48 |

Another suitable LTHC layer includes metal or metal/metal oxide formed as a thin film, for example, black aluminum (i.e., a partially oxidized aluminum having a black visual appearance). Metallic and metal compound films may be formed by techniques such as, for example, sputtering and evaporative deposition. Particulate coatings may be formed using a binder and any suitable dry or wet coating techniques.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

As indicated, a particulate radiation absorber may be disposed in a binder. The weight percent of the radiation absorber in the coating, excluding the solvent in the calculation of weight percent, is generally from 1 wt. % to 50 wt. %, preferably from 3 wt. % to 40 wt. %, and most preferably from 4 wt. % to 30 wt. %, depending on the particular radiation absorber(s) and binder(s) used in the LTHC layer.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, polycarbonates, and acrylic and methacrylic co-polymers. Suitable binders may include monomers, oligomers, or polymers that have been or can be polymerized or crosslinked. In some embodiments, the binder is primarily formed using a coating of crosslinkable monomers and/or oligomers with optional polymer. When a polymer is used in the binder, the binder includes 1 to 50% polymer by non-volatile weight, preferably, 10 to 45% polymer by non-volatile weight.

Upon coating on the donor element, the monomers, oligomers, and polymers are crosslinked to form the LTHC. In some instances, if crosslinking of the LTHC layer is too low, the LTHC layer may be damaged by the heat and/or permit the transfer of a portion of the LTHC layer to the receptor with the transfer layer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50% thermoplastic resin by non-volatile weight, and, preferably, 30 to 45% thermoplastic resin by non-volatile weight, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook,* J. Brandrup, ed., pp. VII 519–557 (1989). In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral resins.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 μm to 20 μm, preferably, 0.5 μm to 10 μm, and, more preferably, 1 μm to 7 μm. An inorganic LTHC layer is coated, in at least some instances, to a thickness in the range of 0.0005 to 10 μm, and preferably, 0.001 to 3 μm.

There may be one or more LTHC layers, and the LTHC layers may contain radiation absorber distributions that are homogeneous or non-homogeneous. The use of non-homogeneous LTHC layers is described in co-assigned U.S. patent application Ser. No. 09/474,002 (entitled "Thermal Mass Transfer Donor Element").

An optional interlayer may be disposed in the donor element between the donor substrate and the transfer layer, typically between an LTHC layer and the transfer layer, for example to minimize damage and contamination of the transferred portion of the transfer layer and/or to reduce distortion in the transferred portion of the transfer layer. The interlayer may also influence the adhesion of the transfer layer to the rest of the donor element and thereby influence the imaging sensitivity of the media. Typically, the interlayer has high thermal resistance. The interlayer typically remains in contact with the LTHC layer during the transfer process and is not substantially transferred with the transfer layer. Examples of interlayers are disclosed in U.S. Pat. No. 5,725,989.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Optionally, the thermal transfer donor element may comprise several interlayers, for example both a crosslinked polymeric film and metal film interlayer, the sequencing of which would be dependent upon the imaging and end-use application requirements. Organic materials suitable as interlayer materials include both thermoset and thermoplastic materials, and are preferably coated on the donor element between the LTHC layer and the transfer layer. Coated interlayers can be formed by conventional coating processes such as solvent coating, extrusion coating, gravure coating, and the like. Suitable thermoset materials include resins that may be crosslinked by heat, radiation, or chemical treatment including, but not limited to, crosslinked or crosslinkable polyacrylates, polymethacrylates, polyesters, epoxies, polyurethanes, and acrylate and methacrylate co-polymers. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is about 25° C. or greater, preferably 50° C. or greater, more preferably 100° C. or greater, and even more preferably 150° C. or greater. In an exemplary embodiment, the interlayer has a $T_g$ that is greater than the highest temperature attained in the transfer layer during imaging. In another exemplary embodiment, the interlayer has a $T_g$ that is greater than the highest temperature attained in the interlayer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, lamination, solvent coating or plasma jet deposition).

The interlayer may provide a number of benefits. The interlayer may be a barrier against the transfer of material from the LTHC layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This can improve the quality (i.e., surface roughness, edge roughness, etc.) of the transferred layer.

The interlayer may contain additives, including, for example, photoinitiators, surfactants, pigments, plasticizers, and coating aids. The thickness of the interlayer may depend on factors such as, for example, the material of the interlayer, the material properties of the interlayer, the material and optical properties and thickness of the LTHC layer, the material and material properties of the transfer layer, the wavelength of the imaging radiation, and the duration of exposure of the donor element to imaging radiation. For polymer interlayers, the thickness of the interlayer typically is in the range of 0.05 μm to 10 μm, preferably, from about 0.1 μm to 6 μm, more preferably, 0.5 to 5 μm, and, most preferably, 0.8 to 4 μm. For inorganic interlayers (e.g., metal or metal compound interlayers), the thickness of the interlayer typically is in the range of 0.005 μm to 10 μm, preferably, from about 0.01 μm to 3 μm, and, more preferably, from about 0.02 to 1 μm.

Table II indicates an exemplary solution for coating an interlayer. Such a solution can be suitably coated, dried, and crosslinked (e.g., by exposure to ultraviolet radiation or an electron beam) to form an interlayer on a donor.

TABLE II

Interlayer Formulation

| Component | Parts by Weight |
|---|---|
| Butvar ™ B-98 (polyvinylbutyral resin, available from Monsanto, St. Louis, MO) | 0.99 |
| Joncryl ™ 67 (acrylic resin, available from S. C. Johnson & Son, Racine, WI) | 2.97 |
| Sartomer ™ SR351 ™ (trimethylolpropane triacrylate, available from Sartomer, Exton, PA) | 15.84 |
| Duracure ™ 1173 (2-hydroxy-2 methyl-1-phenyl-1-propanone photoinitiator, available from Ciba-Geigy, Hawthorne, NY) | 0.99 |
| 1-methoxy-2-propanol | 31.68 |
| methyl ethyl ketone | 47.52 |

An optional underlayer may be disposed in donor elements between the donor substrate and the LTHC layer, as described in co-assigned U.S. patent application Ser. No. 09/473,114 (entitled "Thermal Transfer Donor Element having a Heat Management Underlayer"). Suitable underlayers include the same or similar materials suitable as interlayers. Underlayers can be useful to manage heat transport in the donor elements. Insulative underlayers can protect the donor substrate from heat generated in the LTHC layer during imaging and/or can promote heat transfer toward the transfer layer during imaging. Heat conductive underlayers can promote heat transfer away from the LTHC layer during imaging to reduce the maximum temperature attained in the donor element during transfer. This can be especially useful when transferring heat sensitive materials.

During laser exposure, it may be desirable to minimize formation of interference patterns due to multiple reflections from the imaged material. This can be accomplished by various methods. The most common method is to effectively roughen the surface of the thermal transfer element on the scale of the incident radiation as described in U.S. Pat. No. 5,089,372. This has the effect of disrupting the spatial coherence of the incident radiation, thus minimizing self interference. An alternate method is to employ an antireflection coating within the thermal transfer element. The use of anti-reflection coatings is known, and may consist of quarter-wave thicknesses of a coating such as magnesium fluoride, as described in U.S. Pat. No. 5,171,650.

The donor elements and methods of the present invention may be used in a variety of imaging applications such as proofing, printing plates, security printing, etc. However, the element and method may especially be used advantageously in formation of a color filter element such as for liquid crystal displays, an emissive device such as an organic electroluminescent device, and/or other elements useful in display applications.

The receptor can be any item suitable for a particular application including, but not limited to, glass, transparent films, reflective films, metals, semiconductors, various papers, and plastics. For example, receptors may be any type of substrate or display element suitable for display applications. Receptor substrates suitable for use in displays such as liquid crystal displays or emissive displays include rigid or flexible substrates that are substantially transmissive to visible light. Examples of rigid receptor substrates include glass, indium tin oxide coated glass, low temperature polysilicon (LTPS), thin film transistors (TFTs), and rigid plastic. Suitable flexible substrates include substantially clear and transmissive polymer films, reflective films, transflective films, polarizing films, multilayer optical films, and the like. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 to 100 mils (i.e., 0.05 to 2.54 mm) is preferred.

Receptors may also include previously deposited or patterned layers or devices useful for forming desired end articles (e.g., electrodes, transistors, black matrix, insulating layers, etc.).

For glass receptors, a typical thickness is 0.2 to 2.0 mm. It is often desirable to use glass substrates that are 1.0 mm thick or less, or even 0.7 mm thick or less. Thinner substrates result in thinner and lighter weight displays. Certain processing, handling, and assembling conditions, however, may suggest that thicker substrates be used. For example, some assembly conditions may require compression of the display assembly to fix the positions of spacers disposed between the substrates. The competing concerns of thin substrates for lighter displays and thick substrates for reliable handling and processing can be balanced to achieve a preferred construction for particular display dimensions.

If the receptor substrate is a polymeric film and is to be used for display or other applications where low birefringence in the receptive element is desirable, it may be preferred that the film be non-birefringent to substantially prevent interference with the operation of the display or other article in which it is to be integrated, or, alternatively, it may be preferred that the film be birefringent to achieve desired optical effects. Exemplary non-birefringent receptor substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., those sold under the trade designation Zeonex™ from Nippon Zeon Co., Ltd.). Exemplary birefringent polymeric receptors include multilayer polarizers or mirrors such as those disclosed in U.S. Pat. Nos. 5,882,774 and 5,828,488, and in International Publication No. WO 95/17303.

Receptors may be treated with a silane coupling agents (e.g., 3-aminopropyltriethoxysilane), for example to increase adhesion of the transferred portions of the crosslinked transfer layer. Additionally, a radiation absorber may also be present in the receptor to facilitate transfer of the donor transfer layer to the receptor.

Receptors suitable in the present invention also include materials, elements, devices, etc., capable of being damaged by exposure to heat or radiation, for example. Because the transfer layer can be crosslinked before transfer, it is possible to image onto receptors that might otherwise be damaged if the transferred material was crosslinked by exposure to heat, radiation, chemical curatives, etc., after transfer onto such sensitive receptors.

EXAMPLES

Objects and advantages of this invention are further illustrated by the following examples, but the particular materials and amounts thereof recited in these examples, as well as other conditions and details, should not be construed to unduly limit this invention.

Preparation of Thermal Transfer Donor Elements

A. Black Aluminum LTHC Layer/4 Mil PET Substrate

Black aluminum ($AlO_x$) coatings were deposited onto 4 mil (about 0.1 mm) poly(ethylene terephthalate) (hereafter referred to as "PET") substrate via sputtering of Al in an $Ar/O_2$ atmosphere at a sputtering voltage of 446, vacuum system pressure of $5.0\times10^{-3}$ Torr, oxygen/argon flow ratio of 0.02, and substrate transport speed of about 1 m/min.

The transmission and reflection spectra of the aluminum coated substrates were measured from both the $AlO_x$ coating and substrate (PET) sides using a Shimadzu MPC-3100 spectrophotometer with an integrating sphere. The transmission optical densities (TOD=−log T, where T is the measured fractional transmission) and reflection optical densities (ROD=−log R, where R is the measured fractional reflectance) at 1060 nm are listed in Table III. The thicknesses of the black aluminum coatings were determined by profilometry after masking and etching a portion of the coating with 20 percent by weight aqueous sodium hydroxide and are also included in Table III.

TABLE III

| Sample Designation | Side of Incident Beam | TOD at 1060 nm | ROD at 1060 nm | Thickness Å |
|---|---|---|---|---|
| AS1 | Coating | 0.771 | 0.389 | 535 |
| AS1 | Substrate | 0.776 | 0.522 | 535 |

B. Preparation of Cyan Donor Cy1

1. Preparation of Polyurethane 47.6 g Hüls Dynacol A7250 diol, 50 g 2-butanone, 16.0 g Mobay Desmodur W and 3 drops dibutyltin dilaurate were added in the order listed to a reaction vessel and mixed at ambient temperature. After about 0.5 hour, 2.1 g 1-glycerol methacrylate was added to the reaction mixture, the reaction was allowed to react for an additional hour at ambient temperature. 4.62 g Neopentyl glycol and an additional 15 g 2-butanone were then added to the reaction mixture, and the reaction mixture was allowed to react for 4 days at ambient temperature. At the end of the 4 day reaction period an infrared spectrum of the mixture indicated that all the isocyanate functionality had reacted.

2. Microlith Blue 4G-WA Pigment/polyurethane dispersion 7.92 g Microlith Blue 4G-WA pigment and 32.7 g 2-butanone were combined with stirring. This mixture was then agitated on a Silverson high shear mixer at 0.25 maximum speed for 20 minutes. To this mixture was then added 1.32 g BYK Chemie Disperbyk 161 in 5.0 g 2-butanone, and the resultant mixture was mixed at 0.50 maximum speed for an additional 10 minutes. 19.80 g of the polyurethane from step B.1 was then added and the resultant mixture was agitated at 0.50 maximum speed for an additional 20 minutes.

3. Preparation of Cyan Coating Solution

To 1.80 g of the above Microlith Blue 4G-WA pigment/polyurethane dispersion were added 6.24 g 2-butanone and 12 drops of a 5 weight percent solution of 3M FC-170C in 2-butanone. The resultant mixture was placed on a shaker table and mixed for 10 minutes immediately prior to coating.

4. Coating of Cyan Donor

The cyan coating solution from step B.3 was coated onto the black aluminum coating of a sample from step A using a #4 coating rod. The resultant cyan donor media was dried at 60° C. for 2 minutes to produce donor Cy1.

C. Preparation of Cyan Donor Cy2

1. Preparation of Polyurethane with photoinitiator

To the polyurethane prepared as described above in step B.1 was added 2 percent by weight (based upon the non-volatile content of the polyurethane) Ciba-Geigy Irgacure 651.

2. Microlith Blue 4G-WA Pigment/polyurethane (with photoinitiator) Dispersion

This material was prepared in a manner identical to that indicated above in step B.2 except that the polyurethane with photoinitiator from step C.1 was used in place of the polyurethane from step B.1.

3. Preparation of Cyan Coating Solution

This material was prepared in a manner identical to that indicated above in step B.3. except that the dispersion from step C.2 was substituted for the dispersion from step B.2.

4. Coating of Cyan Donor Cy2

The coating solution from step C.3 was coated onto the black aluminum coating of a sample from step A using a #4 coating rod. The resultant cyan donor media was dried at 60° C. for 2 minutes to produce Cy2.

D. Preparation of Cyan Donor Cy1-X10

Cyan donor Cy1 was irradiated from the cyan coating side with a 10 Mrad dose (125 KeV electrons, $N_2$ inerting) using an ESI Electrocurtain electron beam accelerator. The resultant material is designated Cy1-X10.

E. Preparation of Cyan Donor Cy2-X10

Cyan donor Cy2 was irradiated from the cyan coating side with a 10 Mrad dose (125 KeV electrons, $N_2$ inerting) using an ESI Electrocurtain electron beam accelerator. The resultant material is designated Cy2-X10.

F. Preparation of Cyan Donor Cy1-X800

Cyan donor Cy1 was irradiated with 800 $mJ/cm^2$ from the cyan coating side under $N_2$ inerting using an RPC Equipment UV Processor Model QC1202 (medium pressure Hg lamps). The resultant material is designated Cy1-X800.

G. Preparation of Cyan Donor Cy2-X800

Cyan donor Cy2 was irradiated with 800 $mJ/cm^2$ under $N_2$ inerting using an RPC Equipment UV Processor Model QC1202 (medium pressure Hg lamps). The resultant material is designated Cy2-X800.

Example 1

Preparation of Color Filter Elements

A. Glass substrate/color array elements were prepared according to Table IV via laser induced transfer of the color array (lines parallel to the maximum dimension of the glass substrate with 0.65 mm spacing between adjacent array lines) from the corresponding colorant donor to 75 mm×25 mm×1 mm glass receptor substrates. The corresponding average linewidths of the transferred color arrays lines are also provided in Table IV. The donor samples were imaged using a flat field laser system. The laser utilized was a ND:YAG laser, lasing in the TEM00 mode, at 1064 nm. The power at the image plane and the linear speed of the imaging laser spot utilized for preparation of each of these corresponding LCD color cell array elements are also provided in Table IV. The laser spot diameter in each case was about 80 microns. The donor and glass receptor were held in place with a vacuum with the media translated in a direction perpendicular to the direction of laser scan. The laser was scanned using a linear Galvonometer (General Scanning Model M3-H).

F. Preparation of Glass Substrate/Color Array Element AEX800-Cy1

Glass substrate/color array element AE-Cy1 was irradiated with 800 mJ/cm$^2$ from the color array side with $N_2$ inerting using an RPC Equipment UV Processor Model QC1202 (medium pressure Hg lamps). The resultant glass substrate/color array element is designated AEX800-Cy1.

G. Preparation of Glass Substrate/Color Array Element AEX800-Cy2

Glass substrate/color array element AE-Cy2 was irradiated with 800 mJ/cm$^2$ from the color array side with $N_2$ inerting using an RPC Equipment UV Processor Model QC1202 (medium pressure Hg lamps). The resultant glass substrate/color array element is designated AEX800-Cy2.

Example 2

Determination of Color Filter Element Chemical Resistance

In order to insure the approximate equivalency of the colorant content of the samples to be tested for chemical resistance, the average color array line width for each of the glass substrate/color array elements to be tested for chemical resistance was determined. In all cases the spacing between adjacent array lines is about 0.65 mm. These linewidths are provided in Table V and demonstrate the approximate equivalency of the colorant content of the corresponding samples. Each of the above prepared glass substrate/color array elements was then carefully placed into a separate, sealed glass jar containing 35 ml of 2-butanone. Subsequently, each of the glass substrate/color array elements was extracted with the 2-butanone on an orbital shaker for 114 hours. After this extraction period the glass substrate/color array elements were removed from the corresponding extraction solutions. Each of the extraction solutions was then concentrated to a total volume 2–4 ml and rediluted to a total volume of exactly 4.0 ml with addition of 2-butanone. As a control, a 35 ml portion of 2-butanone was also concentrated to 4 ml. The visible spectra of the cyan coating solution prepared in step B.3. above was obtained in a quartz cuvette with a 1 cm path length on a Shimadzu MPC-3100 spectrophotometer and indicates the $\lambda_{max}$ of the color array materials (Microlith Blue 4G-WA pigment) to be at about 614 nm. The chemical resistance of each of the color array elements is thus inversely related to the corresponding absorbance of its 2-butanone extract at 614 nm and was determined accordingly in a quartz cuvette with a 1 cm path length on a Shimadzu MPC-3100 spectrophotometer. The corresponding results are provided in Table V.

TABLE IV

| Donor Sample Designation | Laser Power at Image Plane (Watts) | Linear Speed of Imaging Laser Spot (m/s) | Line width of Transferred Cyan Line (microns) | Designation of Resultant Glass Substrate/Color Array Element |
|---|---|---|---|---|
| Cy1 (comparative) | 7.0 | 3.6 | 148 | AE-Cy1 |
| Cy2 (comparative) | 7.0 | 3.6 | 150 | AE-Cy2 |
| Cy1-X10 | 6.0 | 3.6 | 153 | AE-Cy1-X10 |
| Cy2-X10 | 6.0 | 3.6 | 144 | AE-Cy2-X10 |
| Cy1-X800 | 6.0 | 3.6 | 151 | AE-Cy1-X800 |
| Cy2-X800 | 6.0 | 3.6 | 157 | AE-Cy2-X800 |

The data in Table IV demonstrates the highly unexpected result that laser induced transfer donor elements comprising radiation crosslinked transfer layer may be imaged with sensitivities comparable to the corresponding laser induced transfer donor elements comprising the respective non-crosslinked transfer layers.

B. Preparation of Glass Substrate/Color Array Element AEX5-Cy1

Glass substrate/color array element AE-Cy1 was irradiated from the color array side with a 5 Mrad dose (125 KeV electrons, $N_2$ inerting) using an ESI Electrocurtain electron beam accelerator. The resultant glass substrate/color array element is designated AEX5-Cy1.

C. Preparation of Glass Substrate/Color Array Element AEX10-Cy1

Glass substrate/color array element AE-Cy1 was irradiated from the color array side with a 10 Mrad dose (125 KeV electrons, $N_2$ inerting) using an ESI Electrocurtain electron beam accelerator. The resultant glass substrate/color array element is designated AEX10-Cy1.

D. Preparation of Glass Substrate/Color Array Element AEX5-Cy2

Glass substrate/color array element AE-Cy2 was irradiated from the color array side with a 5 Mrad dose (125 KeV electrons, $N_2$ inerting) using an ESI Electrocurtain electron beam accelerator. The resultant glass substrate/color array element is designated AEX5-Cy2.

E. Preparation of Glass Substrate/Color Array Element AEX10-Cy2

Glass substrate/color array element AE-Cy2 was irradiated from the color array side with a 10 Mrad dose (125 KeV electrons, $N_2$ inerting) using an ESI Electrocurtain electron beam accelerator. The resultant glass substrate/color array element is designated AEX10-Cy2.

TABLE V

| Color Array Element | Color Array Line width (mm) | Radiation Exposed Element | Radiation Source | Dose | Absorbance (at 614 nm) of Cyan Color Array Extract (2-butanone) |
|---|---|---|---|---|---|
| AE-Cy1 (comparative) | 148 | None | None | None | 0.13 |
| AEX5-Cy1 (comparative) | 157 | Transferred color array | Electron beam | 5 Mrad | 0.04 |
| AEX10-Cy1 (comparative) | 127 | Transferred color array | Electron beam | 10 Mrad | 0.04 |
| AEX800-Cy1 (comparative) | 154 | Transferred color array | UV | 800 mJ/cm$^2$ | 0.04 |
| AE-Cy1-X10 | 153 | Donor colorant layer | Electron beam | 10 Mrad | 0.04 |
| AE-Cy1-X800 | 151 | Donor colorant layer | UV | 800 mJ/cm$^2$ | 0.04 |
| AE-Cy2 (comparative) | 150 | None | None | None | 0.20 |
| AEX5-Cy2 (comparative) | 166 | Transferred color array | Electron beam | 5 Mrad | 0.04 |
| AEX10-Cy2 (comparative) | 163 | Transferred color array | Electron beam | 10 Mrad | 0.04 |
| AEX800-Cy2 (comparative) | 173 | Transferred color array | UV | 800 mJ/cm$^2$ | 0.04 |
| AE-Cy2-X10 | 144 | Donor colorant layer | Electron beam | 10 Mrad | 0.04 |
| AE-Cy2-X800 | 157 | Donor colorant layer | UV | 800 mJ/cm$^2$ | 0.04 |
| 2-Butanone (comparative) | — | — | — | — | 0.03 |

The results summarized in Table V demonstrates the feasibility of imaging donor elements that include a crosslinked component in the transfer layer to obtain imaged articles that have a transferred, crosslinked layer, and in which the performance of the corresponding article attributable to the transferred crosslinked layer is comparable to a similar article in which the crosslinking has been performed subsequent to, rather than prior to, thermal transfer.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A thermal transfer donor element comprising:

a substrate;

a transfer layer comprising a crosslinked material;

a light-to-heat conversion layer disposed between the substrate and the transfer layer to generate heat when the donor element is exposed to imaging radiation; and an interlayer disposed between the light-to-heat conversion layer and the transfer layer, wherein the crosslinked material of the transfer layer is capable of being imagewise transferred from the donor element to a proximately located receptor when the donor element is selectively exposed to imaging radiation.

2. The donor element of claim 1, wherein the crosslinked material is crosslinked by exposure to heat.

3. The donor element of claim 1, wherein the crosslinked material is crosslinked by exposure to radiation.

4. The donor element of claim 1, wherein the crosslinked material is crosslinked by exposure to a chemical curative.

5. The donor element of claim 1, wherein the crosslinked material comprises a polymer.

6. The donor element of claim 1, wherein the crosslinked material comprises an organic polymer.

7. The donor element of claim 1, wherein the crosslinked material comprises a light emitting material.

8. The donor element of claim 1, wherein the crosslinked material comprises a charge carrier.

9. The donor element of claim 1, wherein the transfer layer further comprises a colorant.

10. The donor element of claim 9, wherein the colorant comprises a pigment.

11. The donor element of claim 9, wherein the colorant comprises a dye.

12. The donor element of claim 1, wherein the transfer layer further comprises a dopant disposed in a crosslinked organic conductive, semiconductive, or emissive material.

13. The donor element of claim 1, further comprising light-to-heat converter material disposed in the substrate.

14. The donor element of claim 1, further comprising light-to-heat converter material disposed in the transfer layer.

15. The donor element of claim 1, further comprising light-to-heat converter material disposed in the interlayer.

16. The donor element of claim 1, wherein the light-to-heat conversion layer includes a non-homogeneous distribution of converter material.

17. The donor element of claim 1, further comprising an underlayer disposed between the substrate and the light-to-heat conversion layer.

18. The donor element of claim 1, further comprising a transfer assist layer disposed on the transfer layer as the outermost layer of the donor element.

19. A method of patterning comprising the steps of:

placing a thermal transfer donor element proximate a receptor, the donor element comprising a substrate, a transfer layer comprising a crosslinked material, and a light-to-heat converter material; and imagewise transferring the crosslinked material of the transfer layer to the receptor by selectively exposing the donor element to imaging radiation capable of being absorbed and converted into heat by the converter material.

20. The method of claim 19, further comprising repeating said steps using a different thermal transfer donor element and the same receptor.

21. The method of claim 19, wherein the receptor comprises glass.

22. The method of claim 19, wherein the receptor comprises a flexible film.

23. The method of claim 19, wherein the receptor comprises a display substrate.

24. The method of claim 19, wherein the transfer layer further comprises a colorant.

25. The method of claim 19, wherein the transfer layer comprises a light emitting polymer.

26. The method of claim 19, wherein the imagewise transferred portions of the transfer layer form color filters on the receptor.

27. The method of claim 19, wherein the imagewise transferred portions of the transfer layer form portions of organic electroluminescent devices on the receptor.

28. A method of making a thermal transfer donor element comprising the steps of:

providing a donor substrate;

coating a crosslinkable material adjacent to the substrate;

crosslinking the crosslinkable material to form a crosslinked transfer layer;

disposing a light-to-heat conversion layer between the substrate and the transfer layer that is capable of generating heat upon being exposed to imaging radiation; and disposing an interlayer between the light-to-heat conversion layer and the transfer layer, wherein the crosslinked material of the transfer layer is capable of being imagewise transferred from the donor element to a proximately located receptor when the donor element is selectively exposed to imaging radiation.

29. The method of claim 28, further comprising forming an underlayer between the substrate and the light-to-heat conversion layer.

30. The method of claim 28, wherein the transfer layer further comprises a colorant.

31. The method of claim 28, wherein the transfer layer comprises an organic electroluminescent material.

32. The method of claim 28, wherein the transfer layer comprises an organic charge carrier.

33. A thermal transfer donor element comprising:

a substrate;

a transfer layer comprising a dopant disposed in a crosslinked organic conductive, semiconductive, or emissive material; and a light-to-heat converter material disposed in the thermal transfer donor element to generate heat when the donor element is exposed to imaging radiation, wherein the transfer layer is capable of being imagewise transferred from the donor element to a proximately located receptor when the donor element is selectively exposed to imaging radiation.

34. A thermal transfer donor element comprising:

a substrate;

a transfer layer comprising a crosslinked material;

a light-to-heat converter material disposed in the thermal transfer donor element to generate heat when the donor element is exposed to imaging radiation; and a transfer assist layer disposed on the transfer layer as the outermost layer of the donor element, wherein the transfer layer is capable of being imagewise transferred from the donor element to a proximately located receptor when the donor element is selectively exposed to imaging radiation.

35. An assembly comprising:

a receptor; and a thermal transfer donor comprising a substrate, a transfer layer comprising a crosslinked material, and a light-to-heat converter material disposed in the thermal transfer donor to generate heat when the donor is exposed to imaging radiation, the transfer layer of the donor element in contact with the receptor, wherein the crosslinked material of the transfer layer is capable of being imagewise transferred from the donor element to the receptor when the donor element is selectively exposed to imaging radiation.

* * * * *